United States Patent
Chang et al.

(10) Patent No.: US 7,176,081 B2
(45) Date of Patent: Feb. 13, 2007

(54) LOW TEMPERATURE METHOD FOR METAL DEPOSITION

(75) Inventors: Chih-Fu Chang, Chiayi (TW); Yen-Hsiu Chen, Tainan (TW); Hung-Jen Lin, Tainan (TW); Ming-Chu King, Hsin-Chu (TW); Ching-Hwanq Su, Hsin-Chu (TW); Chih-Mu Huang, Hsin-Chu (TW); Yun Chang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/851,044

(22) Filed: May 20, 2004

(65) Prior Publication Data

US 2005/0260811 A1   Nov. 24, 2005

(51) Int. Cl.
*H01L 21/8242* (2006.01)

(52) U.S. Cl. ............ 438/250; 438/253; 438/393; 438/396; 438/687; 438/688; 257/E27.048; 257/E27.071; 257/E21.351

(58) Field of Classification Search .......... 438/250, 438/253, 393, 396, 687, 688, FOR. 220, 438/FOR. 430; 257/E27.048, E27.071, E21.351
See application file for complete search history.

(56) References Cited

U.S. PATENT DOCUMENTS

| | | | | |
|---|---|---|---|---|
| 6,426,250 | B1 * | 7/2002 | Lee et al. | 438/239 |
| 6,429,127 | B1 * | 8/2002 | Derderian et al. | 438/686 |
| 2001/0034097 | A1 * | 10/2001 | Lim et al. | 438/253 |
| 2002/0058415 | A1 * | 5/2002 | Derderian et al. | 438/686 |
| 2002/0197814 | A1 * | 12/2002 | Marsh et al. | 438/396 |
| 2004/0195653 | A1 * | 10/2004 | Morozumi et al. | 257/532 |
| 2005/0205906 | A1 * | 9/2005 | Udayakumar et al. | 257/295 |

\* cited by examiner

*Primary Examiner*—Michelle Estrada

(74) *Attorney, Agent, or Firm*—Tung & Associates

(57) ABSTRACT

A novel, low-temperature metal deposition method which is suitable for depositing a metal film on a substrate, such as in the fabrication of metal-insulator-metal (MIM) capacitors, is disclosed. The method includes depositing a metal film on a substrate using a deposition temperature of less than typically about 270 degrees C. The resulting metal film is characterized by enhanced thickness uniformity and reduced grain agglomeration which otherwise tends to reduce the operational integrity of a capacitor or other device of which the metal film is a part. Furthermore, the metal film is characterized by intrinsic breakdown voltage ($V_{bd}$) improvement.

16 Claims, 2 Drawing Sheets

LOW TEMPERATURE METHOD FOR METAL DEPOSITION

FIELD OF THE INVENTION

The present invention generally relates to a method for depositing a metal on a substrate, such as during the fabrication of a metal-insulator-metal (MIM) capacitor on the substrate. More particularly, the present invention relates to a low-temperature method for depositing an AlCu metal film on a substrate to enhance film quality and control thickness uniformity.

BACKGROUND OF THE INVENTION

In the fabrication of semiconductor integrated circuits, metal conductor lines are used to interconnect the multiple components in device circuits on a semiconductor wafer. A general process used in the deposition of metal conductor line patterns on semiconductor wafers includes deposition of a conducting layer on the silicon wafer substrate; formation of a photoresist or other mask such as titanium oxide or silicon oxide, in the form of the desired metal conductor line pattern, using standard lithographic techniques; subjecting the wafer substrate to a dry etching process to remove the conducting layer from the areas not covered by the mask, thereby leaving the metal layer in the form of the masked conductor line pattern; and removing the mask layer typically using reactive plasma and chlorine gas, thereby exposing the top surface of the metal conductor lines. Typically, multiple alternating layers of electrically conductive and insulative materials are sequentially deposited on the wafer substrate, and conductive layers at different levels on the wafer may be electrically connected to each other by etching vias, or openings, in the insulative layers and filling the vias using aluminum, tungsten or other metal to establish electrical connection between the conductive layers.

A current drive in the semiconductor device industry is to produce semiconductors having an increasingly large density of integrated circuits which are ever-decreasing in size. These goals are achieved by scaling down the size of the circuit features in both the lateral and vertical dimensions. Vertical downscaling requires that the thickness of gate oxides on the wafer be reduced by a degree which corresponds to shrinkage of the circuit features in the lateral dimension. While there are still circumstances in which thicker gate dielectrics on a wafer are useful, such as to maintain operating voltage compatibility between the device circuits manufactured on a wafer and the current packaged integrated circuits which operate at a standard voltage, ultrathin gate dielectrics will become increasingly essential for the fabrication of semiconductor integrated circuits in the burgeoning small/fast device technology.

The ongoing advances in the field of fabricating miniaturized electronic integrated circuits (ICs) has involved the fabrication of multiple layers of interconnects, or the layers of separate electrical conductors which are formed on top of a substrate and connect various functional components of the substrate and other electrical connections to the IC. Electrical connections between the interconnect layers and the functional components on the substrate are achieved by via interconnects, which are post- or plug-like vertical connections between the conductors of the interconnect layers and the substrate. ICs often have five or more interconnect layers formed on top of the substrate.

Only a relatively short time ago, it was impossible or very difficult to construct an IC with more than one or two layers of interconnects. The topology variations created by forming multiple layers on top of one another resulted in such significant depth of focus problems with lithographic processes that any further additions of layers were neardly impossible to achieve. However, recent advances in semiconductor fabrication planarization techniques, such as chemical mechanical polishing (CMP), have been successful in smoothing relatively significant variations in the height or topography of each interconnect layer. As a result of the smoothing, or planarization, conventional lithographic processes are repetitively used without significant limitation to form considerably more layers of interconnects than had previously been possible.

The multiple interconnect layers occupy volume within the IC, although they do not necessarily occupy additional substrate surface area. Nevertheless, because surface area and volume are critical considerations in Ics, attention has been focused on the effective use of the space between the interconnect layers. Normally, the space between the interconnect layers is occupied by an insulating material, known as an interlayer dielectric (ILD) or intermetal dielectric (IMD), to insulate the electrical signals conducted by the various conductors of the interconnect layers from each other and from the functional components in the underlying substrate.

One effective use for the space between the interconnect layers is the incorporation of capacitors between the interconnect layers in the IMD insulating material separating the interconnect layers. These capacitors form part of the functional components of the IC. Previously, capacitors were constructed in the first layers of IC fabrication immediately above the substrate alongside other structures, such as transistors, so the capacitors were formed of generally the same material used to construct the other functional components, such as polysilicon. Capacitors formed of these materials are generally known as poly-plate capacitors.

Because the conductors of the interconnect layers are metal in construction, the capacitors formed between the interconnect layers are preferably of a metal-insulator-metal (MIM) construction to take advantage of processing steps and performance enhancements. A MIM capacitor has metal plates which are usually formed on the metal conductors of the interconnect layers. Because metal fabrication is required for the conductors of the interconnect layers, the simultaneous or near-simultaneous formation of the metal capacitor plates is readily accomplished without significant additional process steps and manufacturing costs.

MIM capacitors are very valuable in many applications of semiconductor technology. For example, MIMs can be used in RF circuits, analog ICs, high power microprocessor units (MPUs), and DRAM cells. However, alignment marks which lie at the junction of the substrate and the base dielectric layer deposited on the substrate and are important for semiconductor processing, are obscured by the opaque metal layers and transparent IMD layers that are sequentially deposited on the base dielectric layer and on each other. Thus, during fabrication of MIM capacitors it frequently becomes necessary to cut through the metal layers and the intervening dielectric layer or layers of the MIM capacitor to the transparent base dielectric layer on the substrate in order to expose the alignment marks through the layer.

A sectional view of an MIM capacitor 200, with associated structures, fabricated on a wafer substrate 100 is shown in FIG. 1. Preparatory to fabrication of the MIM capacitor 200, metal lines 120, 121 are deposited on the substrate 100. A base dielectric layer 110 is next deposited on the substrate 100 and the metal lines 120, 121.

A bottom metal layer 160, an intermetal dielectric (IMD) layer 170 and an upper metal layer 180 are sequentially deposited above the base dielectric layer 110. An upper dielectric layer 210 is deposited on the base dielectric layer 110 and the upper metal layer 180 of the capacitor 200. Metal lines 250, 251 are fabricated on the upper dielectric layer 210.

A conductive via 150 extends through the base dielectric layer 110 and establishes electrical communication between the metal line 121 and bottom metal layer 160 of the capacitor 200. A conductive via 230 extends through the upper dielectric layer 210 and establishes electrical communication between the metal line 250 and the upper metal layer 180 of the capacitor 200. A conductive via 240 extends through the upper dielectric layer 210 and the base dielectric layer 110 and establishes electrical communication between the metal lines 120 and 251.

Typically, each of the bottom metal layer 160 and the top metal layer 180 is a thin (<2 kA) film of AlCu, and may further include a deposit of TiN or TaN. To enhance electromagnetic properties of the capacitor 200, the bottom metal layer 160 is deposited on the base dielectric layer 110 and the top metal layer 180 is deposited on the IMD layer 170 using a physical vapor deposition (PVD) metal sputtering technique which is carried out at a relatively high temperature (typically about >270 degrees C.). However, at such high deposition temperatures, difficulty is encountered in controlling the thickness uniformity of the layers 160, 180. Furthermore, the high deposition temperatures cause excessive AlCu grain agglomeration in the layers and excessive surface roughness to the upper surface of the layers. Accordingly, a new and improved low-temperature metal deposition method is needed for the deposition of metal layers, particularly AlCu layers in the fabrication of MIM capacitors, for example.

An object of the present invention is to provide a novel method which is suitable for depositing a metal on a substrate.

Another object of the present invention is to provide a novel method which is suitable for depositing a metal of substantially uniform thickness on a substrate.

Still another object of the present invention is to provide a novel method which is suitable for reducing grain agglomeration in a metal layer during layer deposition.

Yet another object of the present invention is to provide a novel method which is suitable for depositing thin metal films in the fabrication of MIM (metal-insulator-metal) capacitors.

A still further object of the present invention is to provide a novel low temperature metal deposition method which includes depositing a metal film on a substrate at reduced temperatures to enhance the thickness uniformity of the metal film and reduce grain agglomeration in the film.

Another object of the present invention is to provide a novel low temperature metal deposition method characterized by intrinsic breakdown voltage improvement.

SUMMARY OF THE INVENTION

In accordance with these and other objects and advantages, the present invention is generally directed to a novel, low-temperature metal deposition method which is suitable for depositing a metal film on a substrate, such as in the fabrication of metal-insulator-metal (MIM) capacitors. The method includes depositing a metal film on a substrate using a deposition temperature of less than typically about 270 degrees C. The resulting metal film is characterized by enhanced thickness uniformity and reduced grain agglomeration which otherwise tends to reduce the operational integrity of a capacitor or other device of which the metal film is a part. Furthermore, the metal film is characterized by intrinsic breakdown voltage ($V_{bd}$) improvement.

BRIEF DESCRIPTION OF THE DRAWINGS

The invention will now be described, by way of example, with reference to the accompanying drawings, in which.

DETAILED DESCRIPTION OF THE INVENTION

The present invention has particularly beneficial utility in the fabrication of MIM (metal-insulator-metal) capacitors which may form a part of microelectronic components such as RF circuits, analog ICs, high power microprocessor units (MPUs), and DRAM cells, for example. However, it is understood that the present invention is equally applicable to a variety of other IC manufacture processes in which formation of a thin metal layer or film is necessary for device fabrication.

The present invention contemplates a novel, low-temperature metal deposition method for depositing a metal film on a substrate, such as in the fabrication of metal-insulator-metal (MIM) capacitors. In MIM capacitor fabrication, the present invention is typically used to form a CBM (capacitor bottom metal) on a dielectric layer and/or a CTM (capacitor top metal) on an IMD (intermetal dielectric) layer that is provided on the CBM of the capacitor. Using a PVD (physical vapor deposition) sputter process, the method of the invention includes depositing a metal film on a dielectric layer or other substrate using a deposition temperature of less than typically about 270 degrees C. Preferably, the low-temperature metal deposition technique of the present invention is carried out in a temperature range of typically about 0 degree C. to about 270 degree C.

The metal film has a thickness of typically less than about 2,000 angstroms. Preferably, the metal film has a thickness of from typically about 100 angstroms to about 5000 angstroms. The resulting metal film is characterized by enhanced thickness uniformity, reduced grain agglomeration which otherwise tends to reduce the operational integrity of a capacitor or other device of which the metal film is a part, and intrinsic breakdown voltage ($V_{bd}$) improvement.

Figure 1:
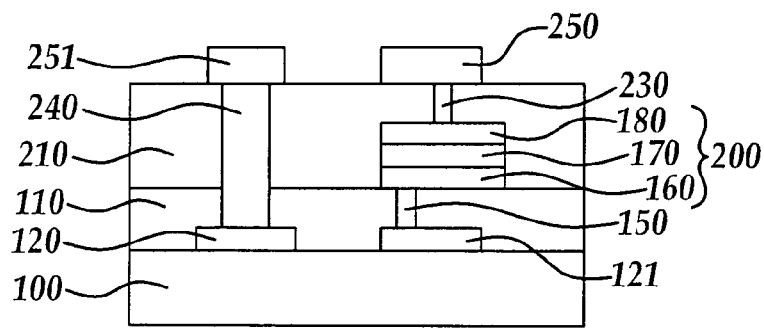
FIG. 1 is a cross-section of a typical MIM (metal-insulator-metal) capacitor fabricated according to a conventional, high-temperature metal deposition method.
Figure 2A:
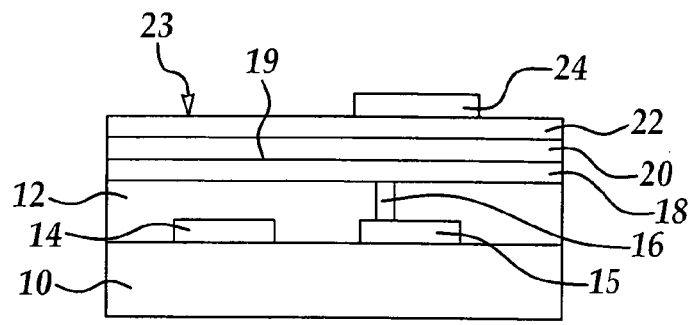
FIGS. 2A–2C are cross-sectional views illustrating sequential process steps in the fabrication of an MIM capacitor, using the low-temperature metal deposition method of the present invention.
Figure 2B:
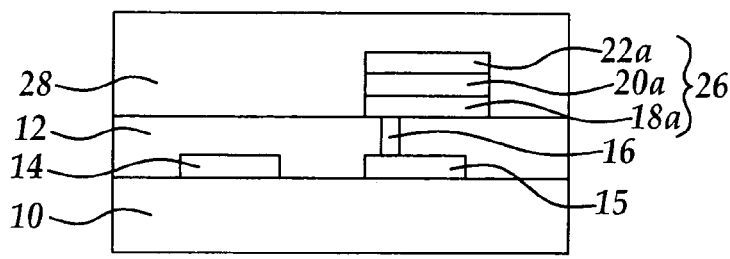
Figure 2C:
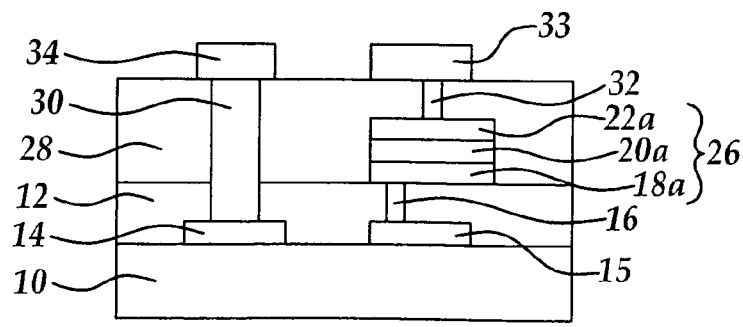

Referring to FIGS. 2A–2C, sequential fabrication of a capacitor 26 (FIG. 2B) is shown in implementation of the low-temperature metal deposition method of the present invention. It is understood that the process steps hereinafter described with respect to FIGS. 2A–2C are illustrative and that the low-temperature metal deposition method of the present invention is equally applicable to capacitor fabrication processes which vary from the steps hereinafter described.

As shown in FIG. 2A, fabrication of an MIM capacitor 26 (FIG. 2B) typically begins with the formation of first level metal lines 14, 15 on a typically silicon substrate 10. A base dielectric layer 12 is deposited on the first level metal lines 14, 15 and the substrate 10, typically using CVD (chemical vapor deposition) techniques which are well-known by those skilled in the art. A contact plug 16 is formed through the base dielectric layer 12 by photolithographic patterning and etching of a via opening through the base dielectric layer 12, to the metal line 15, and filling of the via opening with copper, tungsten or other metal to form the contact plug 16 in electrical contact with the metal line 15.

Following formation of the contact plug 16, a typically AlCu metal layer 18 is deposited on the upper surface of the base dielectric layer 12 and over the contact plug 16. According to the method of the present invention, this metal deposition step is carried out by placing the substrate 10 in a PVD (physical vapor deposition) chamber (not shown). Using a typically AlCu metal target, the PVD sputtering process is carried out at a temperature of less than typically about 270 degrees C. to form a lower metal layer 18 having a thickness of less than typically about 2,000 angstroms, and preferably, from typically about 100 angstroms to typically about 5000 angstroms. Preferably, the PVD process is carried out at a temperature of from typically about 0 degrees C. to typically about 270 degrees C. Most preferably, the PVD process is carried out at a metal deposition temperature of typically about 240 degrees C. The resulting lower metal layer 18 is characterized by substantially uniform thickness and reduced AlCu grain agglomeration, including a smooth upper surface 19.

Following deposition of the lower metal layer 18, an insulating layer 20 is deposited on the bottom metal layer 18, typically using conventional chemical vapor deposition (CVD) techniques. Next, an upper metal layer 22 is deposited on the upper surface of the insulating layer 20. According to the method of the present invention, the upper metal layer 22 is formed using the same process conditions as those used in formation of the lower metal layer 18. This is carried out by placing the substrate 10 in a PVD (physical vapor deposition) chamber (not shown), at a temperature of less than typically about 270 degrees C., and preferably, at a temperature of from typically about 0 degrees C. to typically about 270 degrees C., to form an AlCu upper metal layer 22 having a thickness of less than typically about 2,000 angstroms. Most preferably, the PVD process is carried out at a metal deposition temperature of typically about 240 degrees C. The upper metal layer 22 is characterized by substantially uniform thickness and reduced AlCu grain agglomeration, including a smooth upper surface 23.

Following deposition of the upper metal layer 22, a patterned photoresist layer 24 is formed on the smooth upper surface 23 of the upper metal layer 22, typically using conventional photolithography techniques. The photoresist layer 24 covers areas of the upper metal layer 22 which are to be shielded, and exposes areas of the upper metal layer 22 which are to be etched, during a subsequent etching step. Accordingly, the patterned photoresist layer 24 defines the configuration and dimensions of the capacitor 26 (FIG. 2B) which is to be subsequently fabricated in the lower metal layer 18, the insulating layer 20 and the upper metal layer 22.

The capacitor 26 is formed by etching the portions of the lower metal layer 18, insulating layer 20 and upper metal layer 22 which remain unshielded by the patterned photoresist layer 24. As shown in FIG. 2B, the capacitor 26 includes a CBM (capacitor bottom metal) 18a, which remains after etching of the lower metal layer 18; a capacitor insulating layer 20a, which remains after etching of the insulating layer 20; and a CTM (capacitor top metal) 22a, which remains after etching of the upper metal layer 22. The CBM 18a is disposed in electrical contact with the metal line 15 through the contact plug 16.

Referring next to FIG. 2B, a second IMD (intermetal dielectric layer) 28 is next deposited on the base dielectric layer 12 and on the CTM 22a, typically using conventional CVD techniques. Next, as shown in FIG. 2C, the second IMD 28 is patterned, etched and subjected to a metal deposition process to form a contact plug 32, which extends through the second IMD 28 to the CTM 22a. A second level metal line 33 is formed on the second IMD 28, in electrical contact with the contact plug 32.

As further shown in FIG. 2C, completion of the capacitor structure is typically accomplished by fabrication of a contact plug 30 which extends through the second IMD 28 and base dielectric layer 12, into electrical contact with the metal line 14. A second level metal line 34 is formed on the second IMD 28, in electrical contact with the contact plug 30.

Figure 3:
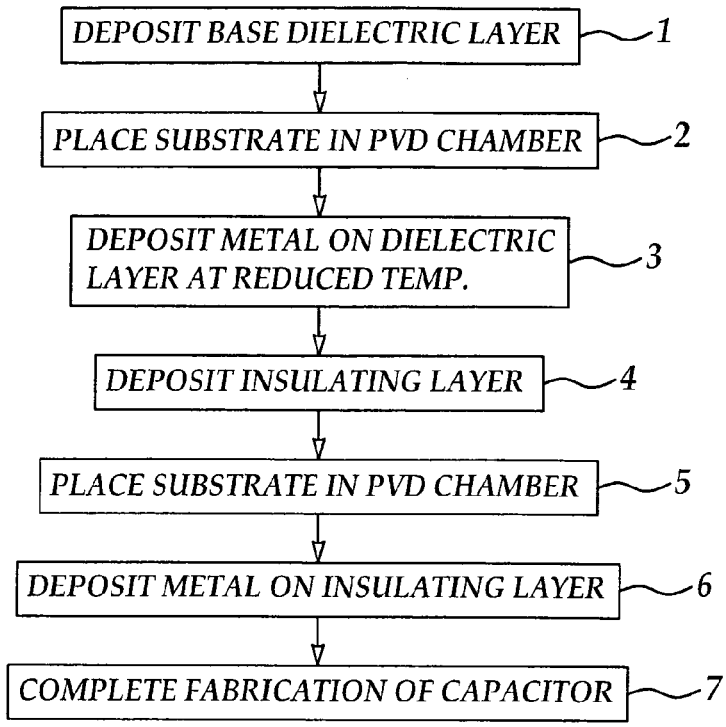
FIG. 3 is a flow diagram which summarizes a typical flow of sequential process steps in the fabrication of a MIM capacitor, using the low-temperature metal deposition method of the present invention.

A flow diagram which summarizes a typical sequence of process steps carried out according to the method of the present invention is shown in FIG. 3. In process step 1, a base dielectric layer is deposited on a substrate. In process step 2, the substrate with the base dielectric layer is placed in a PVD (physical vapor deposition) process chamber; in process step 3, a lower metal layer is deposited on the base dielectric layer at a reduced temperature (less than typically about 270 degrees C.). In process step 4, an insulating layer is deposited on the lower metal layer, typically using CVD techniques. In process step 5, the substrate is again placed in a PVD process chamber. In process step 6, an upper metal layer is deposited on the insulating layer, at a reduced temperature (less than typically about 270 degrees C.). In process step 7, fabrication of the capacitor is completed, with the CBM (capacitor bottom metal) of the capacitor formed by etching the lower metal layer and the CTM (capacitor top metal) of the capacitor formed by etching the upper metal layer.

Figure 4:
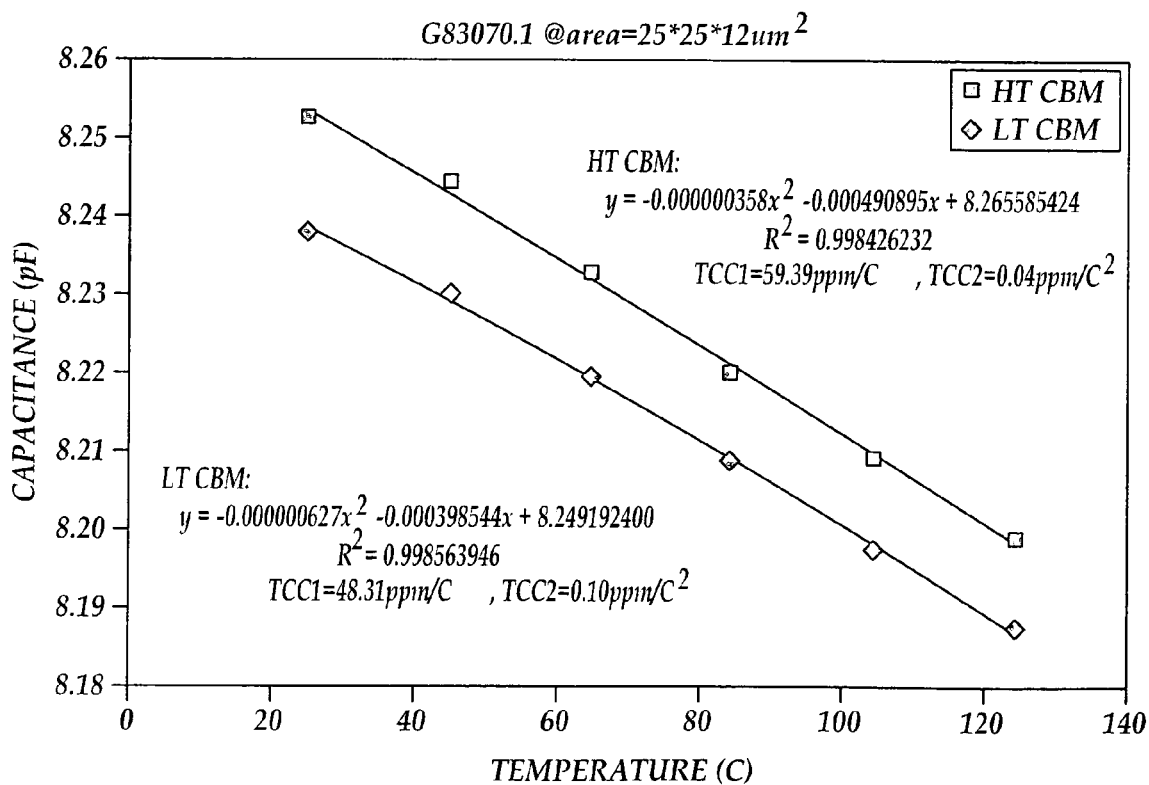
FIG. 4 is a graph wherein capacitance is plotted vs. operational temperature, more particularly illustrating a temperature correlation coefficient performance of a CBM (capacitor bottom-metal) fabricated according to the method of the present invention, as compared to the temperature correlation coefficient performance of a CBM fabricated according to a conventional method.

Referring next to FIG. 4, a graph is shown in which the capacitance values for two capacitors varies according to the operational temperature of the capacitors. One of the capacitors, represented by the line-connected rectangles, has a CBM which was fabricated according to a conventional, high-temperature PVD technique. The other of the capacitors, represented by the line-connected diamonds, has a CBM which was fabricated according to the low-temperature metal deposition technique of the present invention. Based on the graph, it can be seen that the temperature-correlation coefficient (TCC) of the low-temperature CBM capacitor is improved at 18% over the TCC of the high-temperature CBM capacitor (from 59.4 ppm/C to 48.3 ppm/C).

While the preferred embodiments of the invention have been described above, it will be recognized and understood that various modifications can be made in the invention and the appended claims are intended to cover all such modifications which may fall within the spirit and scope of the invention.

What is claimed is:

1. A method of depositing a metal on a substrate, comprising the steps of:
   providing a substrate;
   depositing an AlCu layer of less than about 2,000 angstroms on said substrate at a deposition temperature of less than about 270 degrees C.;
   depositing an insulating layer on said AlCu layer;
   depositing an upper metal layer on said insulating layer; and
   depositing an intermetal dielectric layer on said upper metal layer in contact with said AlCu layer, said insulating layer in contact with said AlCu layer, said insulating layer and said upper metal layer.

2. The method of claim 1 wherein said deposition temperature is about 240 degrees C.

3. The method of claim 1 wherein said AlCu layer is a lower metal layer.

4. The method of claim 3 wherein said deposition temperature is about 240 degrees C.

5. A method of depositing a metal on a substrate, comprising the steps of:
   providing a substrate;
   depositing an AlCu lower metal layer of about 2,000 angstroms on said substrate at a deposition temperature of less than about 270 degrees C.;
   depositing an insulating layer on said lower metal layer; and
   depositing an AlCu upper metal layer on said insulating layer; and
   depositing an intermetal dielectric layer on said substrate and said upper metal layer in contact with said lower metal layer and said insulating layer.

6. The method of claim 5 wherein said substrate comprises a dielectric layer.

7. The method of claim 5 wherein said deposition temperature is about 240 degrees C.

8. The method of claim 7 wherein said substrate comprises a dielectric layer.

9. The method of claim 5 wherein said depositing an AlCu upper metal layer on said insulating layer comprises depositing an AlCu upper layer of loss less than about 2,000 angstroms on said insulating layer at a deposition temperature of less than about 270 degrees C.

10. The method of claim 9 wherein said substrate comprises a dielectric layer.

11. The method of claim 9 wherein said deposition temperature is about 240 degrees C.

12. A method of depositing 11 wherein said substrate comprises a dielectric layer.

13. A method of depositing a metal on a substrate, comprising the steps of:
    providing a substrate;
    depositing a lower metal layer of less than about 2,000 angstroms on said substrate at a deposition temperature of about 240 degrees C.;
    depositing an insulating layer on said lower metal layer; and
    depositing an upper metal layer of less than about 2,000 angstroms on said insulating layer at a deposition temperature of about 240 degrees C.;
    depositing an intermetal dielectric layer on said substrate and said upper metal layer in contact with said lower metal layer and said insulating layer; and
    extending a contact plug through said intermetal dielectric layer and into contact with said upper metal layer.

14. The method of claim 13 wherein said upper metal layer and said lower metal layer each comprises AlCu.

15. The method of claim 13 wherein said deposition temperature is less than about 240 degrees C.

16. The method of claim 15 wherein said upper metal layer and said lower metal layer each comprises AlCu.

* * * * *